(12) United States Patent
Akita et al.

(10) Patent No.: US 8,309,380 B2
(45) Date of Patent: Nov. 13, 2012

(54) PHOTODIODE ARRAY, METHOD FOR MANUFACTURING PHOTODIODE ARRAY, EPITAXIAL WAFER, AND METHOD FOR MANUFACTURING EPITAXIAL WAFER

(75) Inventors: Katsushi Akita, Itami (JP); Takashi Ishizuka, Itami (JP); Kei Fujii, Itami (JP); Youichi Nagai, Osaka (JP); Hideaki Nakahata, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/446,621

(22) Filed: Apr. 13, 2012

(65) Prior Publication Data
US 2012/0196398 A1   Aug. 2, 2012

Related U.S. Application Data

(62) Division of application No. 12/916,150, filed on Oct. 29, 2010, now Pat. No. 8,198,623.

(30) Foreign Application Priority Data

Nov. 4, 2009  (JP) ................................. 2009-252951

(51) Int. Cl.
*H01L 21/00* (2006.01)
(52) U.S. Cl. ............................................. 438/34; 438/80
(58) Field of Classification Search .................. 438/34, 438/80; 257/14, E33.023
See application file for complete search history.

(56) References Cited

U.S. PATENT DOCUMENTS

| 2004/0183095 | A1 | 9/2004 | Hiraoka et al. | |
|---|---|---|---|---|
| 2006/0166391 | A1* | 7/2006 | Nemoto | 438/35 |
| 2007/0264835 | A1 | 11/2007 | Iguchi et al. | |
| 2009/0001412 | A1 | 1/2009 | Nagai et al. | |
| 2009/0242934 | A1 | 10/2009 | Hu | |
| 2010/0051905 | A1 | 3/2010 | Iguchi et al. | |

(Continued)

FOREIGN PATENT DOCUMENTS

| JP | 2001-144278 A | 5/2001 |
|---|---|---|
| WO | WO-2009/041076 A1 | 4/2009 |

OTHER PUBLICATIONS

Sidhu et al., "A Long-Wavelength Photodiode on InP Using Lattice-Matched GaInAs—GaAsSb Type-II Quantum Wells," IEEE Photonics Technology Letters, vol. 17, No. 12, pp. 2715-2717 (2005).

(Continued)

*Primary Examiner* — Phat X Cao
(74) *Attorney, Agent, or Firm* — Venable LLP; Michael A. Sartori

(57) ABSTRACT

Provided are a photodiode array and its manufacturing method, which maintain the crystalline quality of an absorption layer formed on a group III-V semiconductor substrate to obtain excellent characteristics, and which improve the crystallinity at the surface of a window layer; an epitaxial wafer used for manufacturing the photodiode array; and a method for manufacturing the epitaxial wafer. A method for manufacturing a photodiode array 1 having a plurality of absorption regions 21, includes the steps of: growing an absorption layer 7 on an n-type InP substrate 3; growing an InP window layer on the absorption layer 7; and diffusing a p-type impurity in regions, in the window layer 11, corresponding to the plurality of absorption regions 21. The window layer 11 is grown by MOVPE using only metal-organic sources, at a growth temperature equal to or lower than that of the absorption layer 7.

12 Claims, 11 Drawing Sheets

| Window layer growth temperature | 450°C | 475°C | 500°C | 525°C | 580°C | 650°C |
|---|---|---|---|---|---|---|
| Surface defect density (cm$^{-2}$) | 1000 | 1000 | 1000 | 1000 | 1000 | 10 |
| Surface defect area ($\mu$m$^2$) | 20 | 200 | 450 | 750 | 1000 | 2 |
| Percentage of defective pixels (%) | 0.3 | 1.0 | 1.4 | 1.9 | 2.5 | 0.02 |
| Dark current (nA) | 20 | 20 | 20 | 30 | 40 | 200 |
| Dark current density (mA/cm$^2$) | 11 | 11 | 11 | 17 | 23 | 113 |

U.S. PATENT DOCUMENTS

2010/0072457 A1     3/2010    Iguchi et al.
2011/0140082 A1     6/2011    Iguchi et al.

OTHER PUBLICATIONS

Peter et al., "Light-Emitting Diodes and Laser Diodes Based on a $Ga_{1-x}In_xAs/GaAs_{1-y}Sb_y$ Type II superlatice on InP Substrate," Applied Physics Letters, vol. 74, No. 14, pp. 1951-1953 (1999).

Keiper et al., "Metal Organic Vapour-Phase Epitaxy (MOVPE) Growth of InP and InGaAs Using Tertiarybutylarsine (TBA) and Tertiarybutylphosphine (TBP) in $N_2$ ambient," Journal of Crystal Growth, vol. 204, pp. 256-262 (1999).

Kamogawa et al., "Dramatic Reduction of Surface Defects and Particles on pHEMT Epi-Wafers Grown by MOVPE for Higher Yield of Transistors," CS MANTECH Conference, May 18-21, 2009, Tampa, Florida (2009).

\* cited by examiner

FIG. 7

| Window layer growth temperature | 450°C | 475°C | 500°C | 525°C | 580°C | 650°C |
|---|---|---|---|---|---|---|
| Surface defect density (cm$^{-2}$) | 1000 | 1000 | 1000 | 1000 | 1000 | 10 |
| Surface defect area (μm$^2$) | 20 | 200 | 450 | 750 | 1000 | 2 |
| Percentage of defective pixels (%) | 0.3 | 1.0 | 1.4 | 1.9 | 2.5 | 0.02 |
| Dark current (nA) | 20 | 20 | 20 | 30 | 40 | 200 |
| Dark current density (mA/cm$^2$) | 11 | 11 | 11 | 17 | 23 | 113 |

FIG. 9

| Number of runs from reactor cleaning | 5 | 10 | 20 | 30 | 40 | 50 |
|---|---|---|---|---|---|---|
| Surface defect density $(cm^{-2})$ | 300 | 600 | 1300 | 2000 | 2800 | 4000 |
| Surface defect area $(\mu m^2)$ | 78.5 ($10 \mu m \phi$) | 78.5 | 78.5 | 78.5 | 78.5 | 78.5 |
| Percentage of defective pixels (%) | 0.3 | 0.4 | 0.8 | 1.5 | 1.9 | 2.5 |
| Dark current (nA) | 20 | 20 | 20 | 20 | 20 | 20 |
| Dark current density $(mA/cm^2)$ | 11 | 11 | 11 | 11 | 11 | 11 |

PHOTODIODE ARRAY, METHOD FOR MANUFACTURING PHOTODIODE ARRAY, EPITAXIAL WAFER, AND METHOD FOR MANUFACTURING EPITAXIAL WAFER

CROSS-REFERENCE TO RELATED APPLICATIONS

This application is a Divisional of U.S. patent application Ser. No. 12/916,150, filed Oct. 29, 2010, which claims the benefit of Japanese Patent Application No. 2009-252951, filed Nov. 4, 2009, both of which are incorporated herein by reference in their entirety.

BACKGROUND OF THE INVENTION

1. Field of the Invention

The present invention relates to photodiode arrays and epitaxial wafers, which use compound semiconductors, and manufacturing methods thereof. More particularly, the invention relates to photodiode arrays and epitaxial wafers, which use InGaAs/GaAsSb type-II semiconductors, and manufacturing methods thereof.

2. Description of the Background Arts

Recently, much research and development for group III-V compound semiconductors using an InP substrate has been promoted because the band gap energies of these compound semiconductors correspond to the near infrared region. Non-Patent Document 1 (R. Sidhu, "Long-wavelength Photodiode on InP Using Lattice-Matched GaInAs—GaAsSb Type-II Quantum Wells", IEEE Photonics Technology Letters, The Institute of Electrical and Electronics Engineers, Volume 17, No. 12, pp. 2715-2717, (2005)) reports a photodiode having a cutoff wavelength of 2.39 μm, in which an absorption layer having an InGaAs—GaAsSb type-II multiple quantum well structure is formed on an InP substrate, and a pn junction is formed by a p-type or n-type epitaxial layer. Further, Non-Patent Document 1 proposes a photodiode having a cutoff wavelength of 2 μm to 5 μm, which uses an InGaAs—GaAsSb strain-compensated multiple quantum well structure in order to obtain such a longer cutoff wavelength.

Non-Patent Document 2 (M. Peter, "Light-emitting diodes and laser diodes based on a $Ga_{1-x}In_xAs/GaAs_{1-y}Sb_y$ type II superlattice on InP substrate", APPLIED PHYSICS LETTERS, American Institute of Physics, Volume 74, No. 14, pp. 1951-1953, (1999)) discloses light-emitting diodes (LEDs) each including an absorption layer having an InGaAs—GaAsSb type-II multiple quantum well structure, and an InP cladding layer grown on the absorption layer. The InP cladding layer in the LED is grown at 640° C., using phosphine ($PH_3$) as a raw material for P.

Non-Patent Document 3 (D. Keiper, "Metalorganic vapour-phase epitaxy (MOVPE) growth of InP and InGaAs using tertiarybutylarsine (TBA) and tertiarybutylphosphine (TBP) in N2 ambient", Journal of Crystal Growth, ELSEVIER, 204, pp. 256-262, (1999)) discloses growth of InGaAs and InGaAs/InP by metal-organic vapor phase epitaxy (MOVPE) using tertiarybutylarsine (TBAs), tertiarybutylphosphine (TBP), trimethylgallium (TMGa), and trimethylindium (TMIn), and investigation on growth condition dependence of surface defects during the growth. In Non-Patent Document 3, an epitaxial wafer having a low density of surface defects is obtained at a relatively high growth temperature of 660° C. or more.

Patent Document 1 (Japanese Laid-Open Patent Publication No. 2001-144278) discloses a photodiode array having a mesa structure in which photodiodes each composed of laminated semiconductor layers are isolated from each other by etching. This photodiode array is manufactured as follows. An n-type InP layer, an undoped InGaAs light absorption layer, and a p-type InP window layer are disposed in this order on an n-type InP substrate. The InGaAs light absorption layer and the p-type InP window layer are subjected to etching to form individual photodiodes isolated from each other, and the photodiodes are coated with an insulating film. Then, a p-type ohmic electrode is formed on the p-type InP window layer of each photodiode while a common n-type ohmic electrode is formed on the rear surface of the n-type InP substrate.

SUMMARY OF THE INVENTION

In the photodiode array disclosed in Patent Document 1, it is desired to reduce the percentage of defectives among a plurality of photodiodes (hereinafter, also referred to as pixels) arranged one-dimensionally or two-dimensionally. Since defective pixels are caused by irregularities (surface defects) having a height of 10 nm or more at the surface of the window layer, it is important to reduce the density of surface defects.

Generally, in manufacturing of the photodiode array having the structure disclosed in Patent Document 1, phosphine ($PH_3$) is used as a raw material for P when an InP window layer is formed on an InGaAs light absorption layer. In this case, the growth temperature must be set at a high temperature of 640° C. as described in Non-Patent Document 2. Therefore, the crystalline quality of the light absorption layer is degraded by heat when the InP window layer is grown, which contributes to pixel defects.

In Non-Patent Document 1, an InGaAs layer is provided as a window layer on the absorption layer. However, when an electrode and a passivation layer are formed on the InGaAs layer, dark current at the crystal surface is undesirably increased because of insufficient accumulation of technical knowledge.

Non-Patent Document 3 describes that surface defects of InP are significantly reduced by setting the InP growth temperature at 660° C. or more. However, if the InP window layer is grown at such a high temperature as 660° C. or more, the crystalline quality of the absorption layer is degraded by heat when the InP window layer is grown, which contributes to pixel defects.

Accordingly, it is an object of the present invention to provide: a photodiode array and its manufacturing method, which can improve the crystalline quality of an absorption layer formed on a group III-V semiconductor substrate to realize excellent characteristics, and which can improve the crystallinity at the surface of a window layer; an epitaxial wafer used for manufacturing of the photodiode array; and a method for manufacturing the epitaxial wafer.

In order to solve the above-described problems, the present invention provides a method for manufacturing a photodiode array having a plurality of absorption regions that are one-dimensionally or two-dimensionally arranged. The method includes: an absorption layer formation step of growing an absorption layer on a first conductivity type group III-V semiconductor substrate; a window layer formation step of growing a window layer on the absorption layer, which window layer is composed of a compound semiconductor including P, and has a band gap energy greater than a band gap energy of the absorption layer; and an impurity diffusion step of diffusing a second conductivity type impurity in regions, in the window layer, corresponding to the plurality of absorption regions. In the window layer formation step, the window layer is grown by metal-organic vapor phase epitaxy using only metal-organic sources, and a growth temperature of the window layer is equal to or lower than a growth temperature of the absorption layer.

In the method for manufacturing a photodiode array according to the present invention, a window layer composed of a compound semiconductor including P is grown on the absorption layer. As compared to the case where an InGaAs layer is provided as a window layer (Non-Patent Document 1), the window layer composed of a compound semiconductor including P allows electrodes and a passivation layer to be favorably formed thereon, and thus dark current at the crystal surface is reduced. Further, in the window layer formation step, the window layer is grown by metal-organic vapor phase epitaxy (MOVPE) using only metal-organic sources, and the growth temperature of the window layer is equal to or lower than that of the absorption layer. In the MOVPE using only metal-organic sources, tertiarybutylphosphine (TBP) or the like, which is an organic metal, is used as a raw material for P. Therefore, even when the growth temperature of the window layer is reduced as compared to that of the ordinary MOVPE using phosphine, the crystallinity of the window layer is not degraded, and thus excellent device characteristics are obtained. In addition, since the growth temperature of the window layer is equal to or lower than that of the absorption layer, the absorption layer is prevented from being affected by the growth of the window layer. Therefore, the crystalline quality of the absorption layer is maintained, and thus excellent characteristics are obtained.

In the above-described method for manufacturing a photodiode array, the absorption layer may be grown by MOVPE using only metal-organic sources in the absorption layer formation step. Alternatively, the absorption layer may be grown by molecular beam epitaxy. According to the above-described method for manufacturing a photodiode array, regardless of whether the growth method of the absorption layer is the same as or different from the growth method of the window layer, the absorption layer is prevented from being affected by the growth of the window layer. Therefore, the crystalline quality of the absorption layer is maintained, and thus excellent characteristics are obtained.

In the above-described method for manufacturing a photodiode array, the growth temperature of the window layer may be equal to or higher than 400° C. but lower than 600° C. When the growth temperature of the window layer is lower than 600° C., the crystalline quality of the absorption layer can be favorably maintained even if the absorption layer includes a material, such as GaAsSb, that is not resistant to heat. When the growth temperature of the window layer is lower than 400° C., the crystalline quality of the window layer cannot be maintained favorably although the degree of surface defects is lessened, which causes a difficulty in obtaining excellent device characteristics.

A first photodiode array according to the present invention has a plurality of absorption regions arranged one-dimensionally or two-dimensionally, and includes: an absorption layer disposed on a first conductivity type group III-V semiconductor substrate; and a window layer disposed on the absorption layer, which window layer is composed of a compound semiconductor including P, has a band gap energy greater than a band gap energy of the absorption layer, and includes a second conductivity type impurity being diffused in regions thereof corresponding to the plurality of absorption regions. The percentage of defective absorption regions among the plurality of absorption regions, which are caused by surface defects of the window layer, is equal to or greater than 0.03% but not greater than 2%.

The percentage of defective absorption regions means the percentage of absorption regions, among the plurality of absorption regions, which do not function as photodiodes due to dark current failure and/or sensitivity failure. Since the percentage of defective absorption regions is equal to or greater than 0.03%, the growth temperature of the window layer need not be set at a high temperature such as 660° C. or more as in Non-Patent Document 3 in order to reduce surface defects of the window layer. Accordingly, the absorption layer is prevented from being affected by the growth of the window layer, and thus the crystalline quality of the absorption layer is maintained, resulting in excellent characteristics. In addition, focusing onto the wafer surface is facilitated, which makes it easy to perform surface inspection and device fabrication. Since the percentage of defective absorption regions is not greater than 2%, sufficient characteristics are obtained for applications of the photodiode array to cameras or the like.

A second photodiode array according to the present invention has a plurality of absorption regions arranged one-dimensionally or two-dimensionally, and includes: an absorption layer disposed on a first conductivity type group III-V semiconductor substrate; and a window layer disposed on the absorption layer, which window layer is composed of a compound semiconductor including P, has a band gap energy greater than a band gap energy of the absorption layer, and includes a second conductivity type impurity being diffused in regions thereof corresponding to the plurality of absorption regions. The surface defect density of the window layer is equal to or greater than 50 $cm^{-2}$ but not greater than 3000 $cm^{-2}$.

Since the surface defect density of the window layer is equal to or greater than 50 $cm^{-2}$, the growth temperature of the window layer need not be set at a high temperature such as 660° C. or more as in Non-Patent Document 3 in order to reduce surface defects of the window layer. In addition, when manufacturing the photodiode array, excessive control for the epitaxial wafer having the absorption layer and the window layer grown on the group III-V semiconductor substrate is not required, resulting in a reduction in manufacturing cost. Further, focusing onto the wafer surface is facilitated, which makes it easy to perform wafer surface inspection and device fabrication. Utilizing this, screening inspection for defective wafers based on the density range is realized. Since the surface defect density of the window layer is not greater than 3000 $cm^{-2}$, sufficient characteristics are obtained for applications of the photodiode array to cameras or the like.

A third photodiode array according to the present invention has a plurality of absorption regions arranged one-dimensionally or two-dimensionally, and includes: an absorption layer disposed on a first conductivity type group III-V semiconductor substrate; and a window layer disposed on the absorption layer, which window layer is composed of a compound semiconductor including P, has a band gap energy greater than a band gap energy of the absorption layer, and includes a second conductivity type impurity being diffused in regions thereof corresponding to the plurality of absorption regions. The average area of surface defects of the window layer is equal to or greater than 3 $\mu m^2$ but not greater than 800 $\mu m^2$.

Since the average area of surface defects of the window layer is equal to or greater than 3 $\mu m^2$, the growth temperature of the window layer need not be set at a high temperature such as 660° C. or more in order to reduce surface defects of the window layer. Accordingly, the absorption layer is prevented from being affected by the growth of the window layer, and thus the crystalline quality of the absorption layer is maintained, resulting in excellent characteristics. Further, focusing onto the wafer surface is facilitated, which makes it easy to perform wafer surface inspection and device fabrication. Utilizing this, screening inspection for defective wafers based on the density range is realized. Since the average area of surface defects of the window layer is not greater than 800 µm², sufficient characteristics are obtained for applications of the photodiode array to cameras or the like.

In the first to third photodiode arrays, each of the surface defects of the window layer has a concave or convex shape having a height of 10 nm or more.

In the above-described method for manufacturing a photodiode array, a window layer composed of InP may be grown in the window layer formation step. Likewise, in the above-described first to third photodiode arrays, the window layer may be composed of InP. Accumulation of technical knowledge for forming a passivation layer on the surface of InP crystal is greater than that for forming a passivation layer on the surface of InGaAs crystal. Therefore, dark current at the crystal surface can be easily reduced. Further, when light comes in the absorption layer through the window layer, dark current can be effectively reduced while preventing absorption of near infrared light in a region on the light-incoming side relative to the absorption layer.

In the above-described method for manufacturing a photodiode array, an absorption layer having a multiple quantum well structure may be formed in the absorption layer formation step. Likewise, in the above-described first to third photodiode arrays, the absorption layer may have a multiple quantum well structure. In the case where the absorption layer has a multiple quantum well structure, if the window layer is grown at a high temperature, steepness of the interface between the well layer and the barrier layer is degraded, which may cause a reduction in device characteristics such as light-to-electricity conversion efficiency. However, according to the above-described photodiode array manufacturing method and photodiode arrays, even when the absorption layer has a multiple quantum well structure, the crystalline quality of the absorption layer is maintained, and thus excellent characteristics are obtained.

In the above-described method for manufacturing a photodiode array, the group III-V semiconductor substrate may be an InP substrate, and an absorption layer having a multiple quantum well structure may be formed in the absorption layer formation step by alternately growing layers including InGaAs and layers including GaAsSb. Likewise, in the above-described first to third photodiode arrays, the group III-V semiconductor substrate may be an InP substrate, and the absorption layer may have a multiple quantum well structure in which layers including InGaAs and layers including GaAsSb are alternately laminated. In the case where the absorption layer has such a structure, if the window layer is grown at a high temperature, steepness of the interface between the GaAsSb layer and the InGaAs layer is degraded because GaAsSb is not resistant to heat, which may cause a deterioration of device characteristics. However, according to the above-described photodiode array manufacturing method and photodiode arrays, even when the absorption layer has the multiple quantum well structure in which layers including InGaAs and layers including GaAsSb are alternately laminated, the crystalline quality of the absorption is maintained, and thus excellent characteristics are obtained.

In the above-described method for manufacturing a photodiode array, the multiple quantum well structure of the absorption layer may be formed in the absorption layer formation step by alternately growing $In_xGa_{1-x}As$ ($0.38 \leq x \leq 0.68$) and $GaAs_{1-y}Sb_y$ ($0.36 \leq y \leq 0.62$), or by alternately growing $Ga_{1-u}In_uN_vAs_{1-v}$ ($0.4 \leq u \leq 0.8$, $0 \leq v \leq 0.2$) and $GaAs_{1-y}Sb_y$ ($0.36 \leq y \leq 0.62$). Likewise, in the above-described first to third photodiode arrays, the multiple quantum well structure of the absorption layer may be composed of pairs of $In_xGa_{1-x}As$ ($0.38 \leq x \leq 0.68$) and $GaAs_{1-y}Sb_y$ ($0.36 \leq y \leq 0.62$), or pairs of $Ga_{1-u}In_uN_vAs_{1-v}$ ($0.4 \leq u \leq 0.8$, $0 \leq v \leq 0.2$) and $GaAs_{1-y}Sb_y$ ($0.36 \leq y \leq 0.62$). Thereby, a large number of absorption regions 21, such as photodiodes, each having responsivity in the near infrared region can be manufactured with efficiency while maintaining excellent crystallinity.

In order to solve the above-described problems, the present invention provides a method for manufacturing an epitaxial wafer which is used for manufacturing a photodiode array having a plurality of absorption regions arranged one-dimensionally or two-dimensionally. The method includes: an absorption layer formation step of growing an absorption layer on a first conductivity type group III-V semiconductor substrate; and a window layer formation step of growing a window layer on the absorption layer, which window layer is composed of a compound semiconductor including P, and has a band gap energy greater than a band gap energy of the absorption layer. In the window layer formation step, the window layer is grown by metal-organic vapor phase epitaxy using only metal-organic sources, and a growth temperature of the window layer is equal to or lower than a growth temperature of the absorption layer.

In the method for manufacturing an epitaxial wafer according to the present invention, like the above-described method for manufacturing a photodetector array, a window layer composed of a compound semiconductor including P is grown on the absorption layer. Therefore, electrodes and a passivation layer can be favorably formed on the window layer, and thus dark current at the crystal surface is reduced. Further, in the window layer formation step, the window layer is grown by MOVPE using only metal-organic sources, at a growth temperature equal to or lower than that of the absorption layer. Therefore, the absorption layer is prevented from being affected by the growth of the window layer, and thus the crystalline quality of the absorption layer is maintained, resulting in excellent characteristics.

In the above-described method for manufacturing an epitaxial wafer, the absorption layer may be grown by MOVPE using only metal-organic sources in the absorption layer formation step. Alternatively, the absorption layer may be grown by molecular beam epitaxy. According to the above-described method for manufacturing an epitaxial wafer, regardless of whether the growth method of the absorption layer is the same as or different from the growth method of the window layer, the absorption layer is prevented from being affected by the growth of the window layer. Therefore, the crystalline quality of the absorption layer is maintained, and thus excellent characteristics are obtained.

In the above-described method for manufacturing an epitaxial wafer, the growth temperature of the window layer may be equal to or higher than 400° C. but lower than 600° C. When the growth temperature of the window layer is lower than 600° C., the crystalline quality of the absorption layer can be favorably maintained even if the absorption layer includes a material, such as GaAsSb, that is not resistant to heat. When the growth temperature of the window layer is lower than 400° C., the crystalline quality of the window layer cannot be maintained favorably although the degree of surface defects is lessened, which causes a difficulty in obtaining excellent device characteristics.

A first epitaxial wafer according to the present invention is an epitaxial wafer used for manufacturing a photodiode array having a plurality of absorption regions arranged one-dimensionally or two-dimensionally, and the epitaxial wafer includes: an absorption layer disposed on a first conductivity type group III-V semiconductor substrate; and a window layer disposed on the absorption layer, which window layer is composed of a compound semiconductor including P, and has a band gap energy greater than a band gap energy of the absorption layer. The surface defect density of the window layer is equal to or greater than 50 cm$^{-2}$ but not greater than 3000 cm$^{-2}$.

Since the surface defect density of the window layer is equal to or greater than 50 cm$^{-2}$, the growth temperature of the window layer need not be set at a high temperature such as 660° C. or more as in Non-Patent Document 3 in order to reduce surface defects of the window layer. Further, when manufacturing the photodiode array, excessive control for the epitaxial wafer having the absorption layer and the window layer grown on the group III-V semiconductor substrate is not required, resulting in a reduction in manufacturing cost. Further, focusing onto the wafer surface is facilitated, which makes it easy to perform wafer surface inspection and device fabrication. Utilizing this, screening inspection for defective wafers based on the density range is realized. Since the surface defect density of the window layer is not greater than 3000 cm$^{-2}$, sufficient characteristics are obtained for applications of the photodiode array to cameras or the like.

A second epitaxial wafer according to the present invention is an epitaxial wafer used for manufacturing a photodiode array having a plurality of absorption regions arranged one-dimensionally or two-dimensionally, and the epitaxial wafer includes an absorption layer disposed on a first conductivity type group III-V semiconductor substrate; and a window layer disposed on the absorption layer, which window layer is composed of a compound semiconductor including P, and has a band gap energy greater than a band gap energy of the absorption layer. The average area of surface defects of the window layer is equal to or greater than 3 µm$^2$ but not greater than 800 µm$^2$.

Since the average area of surface defects of the window layer is equal to or greater than 3 µm$^2$, the growth temperature of the window layer need not be set at a high temperature such as 660° C. or more as in Non-Patent Document 3 in order to reduce surface defects of the window layer. Accordingly, the absorption layer is prevented from being affected by the growth of the window layer, and thus the crystalline quality of the absorption layer is maintained, resulting in excellent characteristics. Further, focusing onto the wafer surface is facilitated, which makes it easy to perform wafer surface inspection and device fabrication. Utilizing this, screening inspection for defective wafers based on the density range is realized. Since the average area of surface defects of the window layer is not greater than 800 µm$^2$, sufficient characteristics are obtained for applications of the photodiode array to cameras or the like.

In the first and second epitaxial wafers, each of the surface defects of the window layer has a concave or convex shape having a height of 10 nm or more.

According to the present invention, it is possible to provide: a photodiode array and its manufacturing method, which can maintain the crystalline quality of an absorption layer formed on a group III-V semiconductor substrate to realize excellent characteristics, and which can improve the crystallinity at the surface of a window layer; an epitaxial wafer used for manufacturing of the photodiode array; and a method for manufacturing the epitaxial wafer.

BRIEF DESCRIPTION OF THE DRAWING

FIG. 7 is a diagram showing the surface defect density of the window layer 11 (11b), the average area of surface defects, the percentage of defective absorption regions, among the absorption regions 21, caused by surface defects, the dark current, and the dark current density, which depend on the growth temperature of the window layer 11 (11b);

FIG. 9 is a diagram showing the correlations, in the photodiode array 1, among the number of runs from reactor cleaning, the surface defect density, the average area of surface defects, the percentage of defective absorption regions among the absorption regions 21, the dark current, and the dark current density.

DETAILED DESCRIPTION OF THE INVENTION

Figure 1:
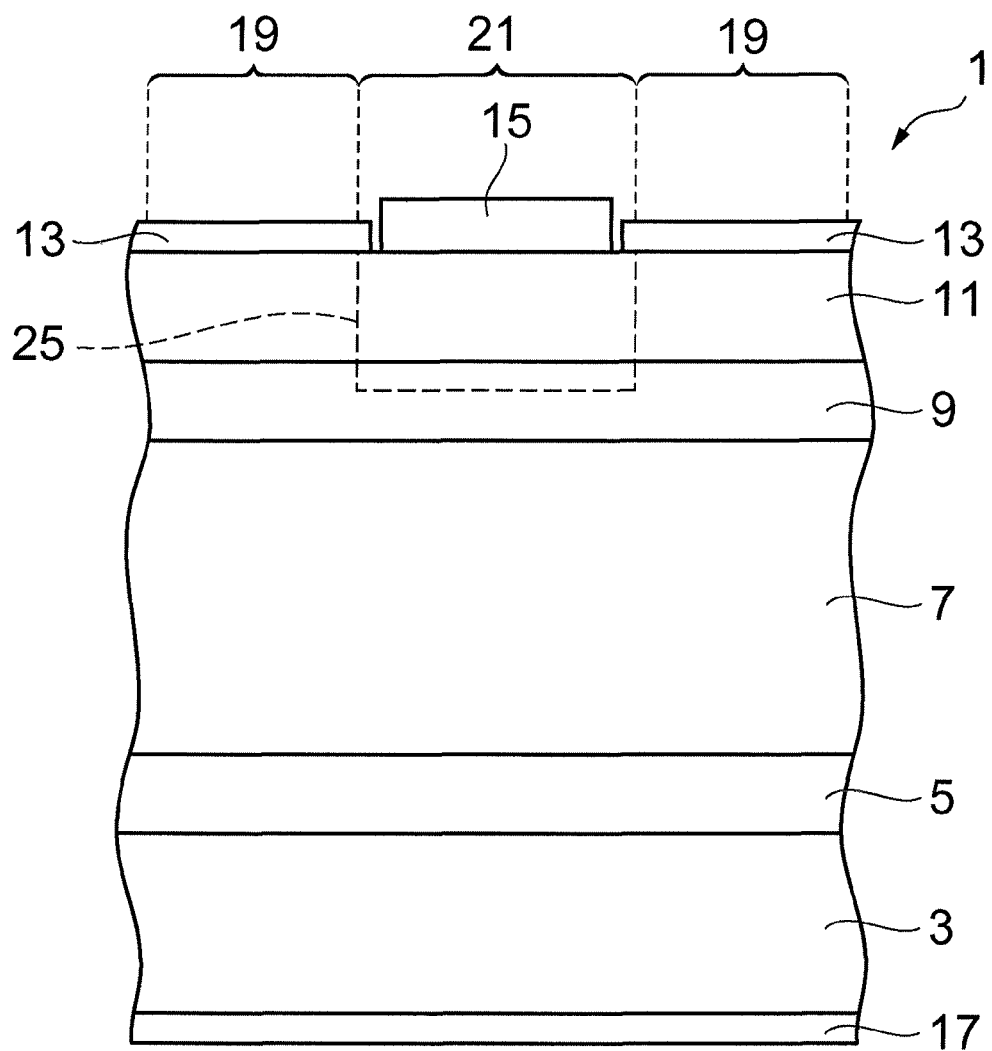
FIG. 1 is an enlarged view showing a part of a structure of a photodiode array 1 according to an embodiment of the present invention.

Hereinafter, preferred embodiments of the present invention will be described in detail with reference to the drawings. In the description of drawings, if possible, the same elements are represented by the same reference numerals, and duplication of description is avoided.

FIG. 1 is an enlarged view showing a part of the structure of a photodiode array 1 according to an embodiment of the present invention. The photodiode array 1 includes a plurality of absorption regions (also referred to as pixels) arranged one-dimensionally or two-dimensionally. The photodiode array 1 further includes a substrate 3, a semiconductor layer 5, an absorption layer 7, a diffusion concentration adjusting layer 9, a window layer 11, a passivation layer (insulating layer) 13, a plurality of p-type (second conductivity type) electrodes 15, and an n-type (first conductivity type) electrode 17.

The substrate 3 is a group III-V semiconductor substrate of the present embodiment, and is composed of InP, for example. The substrate 3 is Si-doped, and has an n-type conductivity. A buffer layer (not shown) on the substrate 3 is composed of n-type InP, and has a thickness of about 10 nm. The semiconductor layer 5 is disposed on the substrate 3 with the buffer layer intervening therebetween, and the buffer layer is in contact with the rear surface of the semiconductor layer 5. The semiconductor layer 5 is composed of n-type InGaAs, and has a thickness of about 150 nm.

The absorption layer 7 is disposed on the surface of the semiconductor layer 5, and the diffusion concentration adjusting layer 9 is disposed on the absorption layer 7. The rear surface of the diffusion concentration adjusting layer 9 is in contact with the absorption layer 7. The absorption layer 7 is disposed between the semiconductor layer 5 and the diffusion concentration adjusting layer 9 (in other words, the absorption layer 7 is disposed between the substrate 3 and the diffusion concentration adjusting layer 9). The absorption layer 7 of the present embodiment has a multiple quantum well structure in which a plurality of quantum well layers and a plurality of barrier layers are alternately laminated.

For example, the absorption layer 7 may have a type-II multiple quantum well structure in which a plurality of InGaAs layers and a plurality of GaAsSb layers, which are included in the absorption layer 7, are alternately laminated. The absorption layer 7 includes, for example, 250 pairs of the InGaAs layers and the GaAsSb layers. The thickness of each InGaAs layer is about 5 nm, and the thickness of each GaAsSb layer is also about 5 nm. The specific compositions of the InGaAs layer and the GaAsSb layer in the absorption layer 7 are $In_xGa_{1-x}As$ ($0.38 \leq x \leq 0.68$) and $GaAs_{1-y}Sb_y$ ($0.36 \leq y \leq 0.62$), respectively. The absorption layer 7 may include 250 pairs of $Ga_{1-t}In_tN_uAs_{1-u}$ ($0.4 \leq t \leq 0.8$, $0 < u \leq 0.2$) and $GaAs_{1-v}Sb_v$ ($0.36 \leq v \leq 0.62$). When the absorption layer 7 has the compositions as described above, a large number of absorption regions 21, such as photodiodes, each having responsivity in the near infrared region can be manufactured with efficiency while maintaining excellent crystallinity.

The diffusion concentration adjusting layer 9 is disposed between the absorption layer 7 and the window layer 11. The window layer 11 is disposed on the diffusion concentration adjusting layer 9, and the surface of the diffusion concentration adjusting layer 9 is in contact with the rear surface of the window layer 11. The passivation layer 13 is disposed on the surface of the window layer 11, and the passivation layer 13 has openings. A plurality of p-type electrodes 15 are disposed on the surface of the window layer 11, and contact the surface of the window layer 11.

The diffusion concentration adjusting layer 9 is composed of InGaAs that is a group III-V semiconductor, and has a thickness of about 1.0 μm. The diffusion concentration adjusting layer 9 is undoped. The window layer 11 is composed of a compound semiconductor including P, for example, InP that is a group III-V semiconductor, and has a thickness of about 0.8 μm. The window layer 11 has a band gap energy greater than those of the absorption layer 7 and the diffusion concentration adjusting layer 9. The window layer 11 is doped with Si which is an n-type dopant.

A semiconductor region consisting of the diffusion concentration adjusting layer 9 and the window layer 11 includes a region 19 and a plurality of absorption regions 21. Each of the plurality of absorption regions 21 has sides that abut the region 19. Each of the plurality of absorption regions 21 is formed of an impurity diffusion region 25, and the impurity diffusion region 25 is doped with a predetermined impurity element (Zn in the present embodiment).

Each of the plurality of p-type electrodes 15 is disposed on a region, in the window layer 11, corresponding to the impurity diffusion region 25 forming each absorption region 21 so as to be placed in the opening of the passivation layer 13. The p-type electrode 15 is in ohmic contact with the window layer 11. The n-type electrode 17 is disposed on the rear surface of the substrate 3, and is in contact with the rear surface. The n-type electrode 17 is in ohmic contact with the substrate 3. The n-type electrode 17 is common to all the absorption regions 21.

Figure 2:
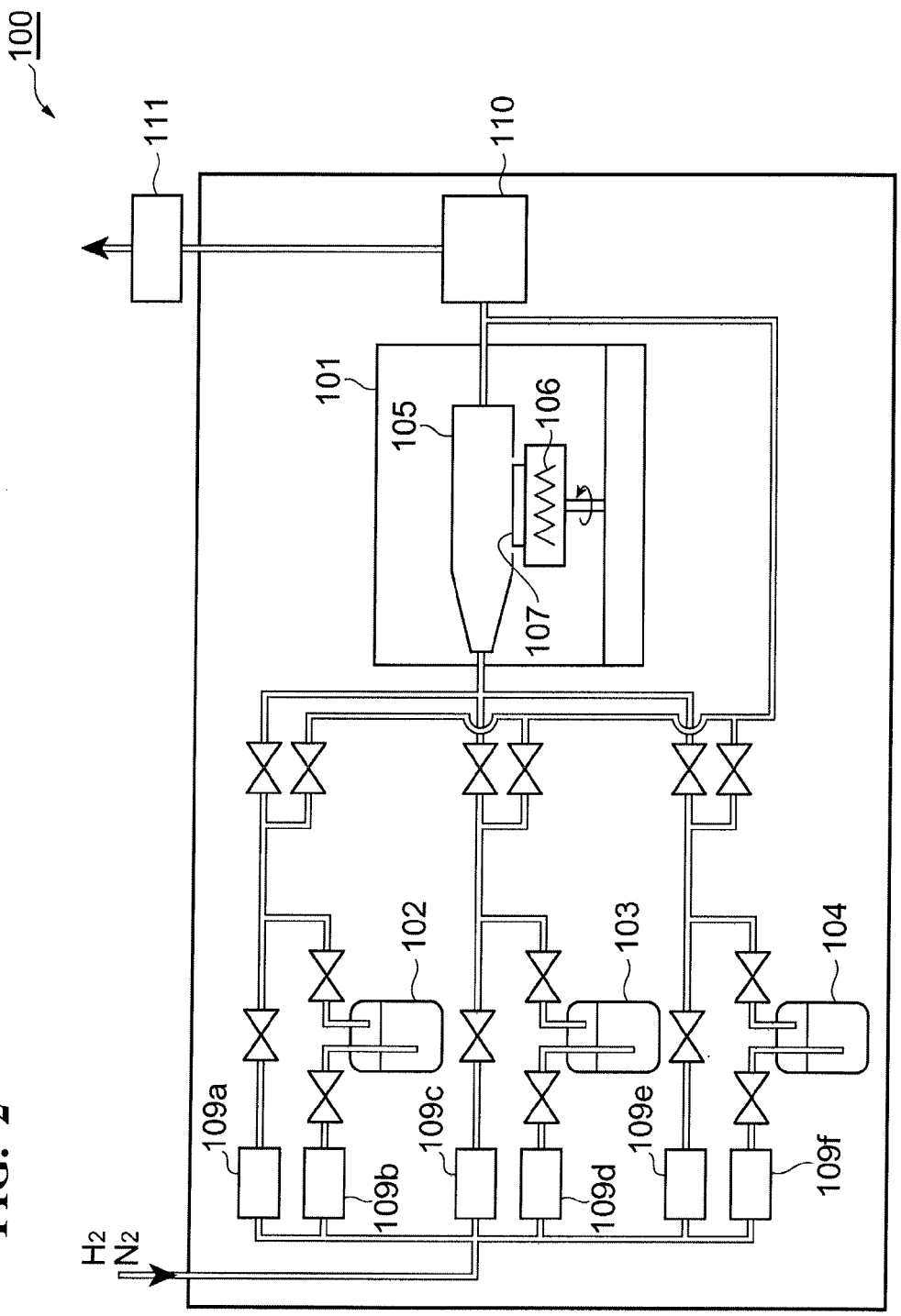
FIG. 2 is a diagram showing a structure of an MOVPE apparatus 100 used for manufacturing the photodiode array 1.

Hereinafter, a method for manufacturing the photodiode array 1 will be described. FIG. 2 is a diagram showing the structure of an MOVPE apparatus 100 used for the manufacturing method of the present embodiment. The MOVPE apparatus 100 includes a reactor 101, and first to third raw material supply sources 102, 103, and 104 for supplying raw materials to the reactor 101. The reactor 101 is a so-called horizontal reactor having a quartz flow-channel 105 in which a flow path is formed in the horizontal direction. The substrate 3 is put on a susceptor 107 having a heater 106. The susceptor 107 rotatably supports the substrate 3.

The first raw material supply source 102 contains, for example, triethylgallium (TEGa), trimethylaluminum (TMAl), and trimethylindium (TMIn) which are organic metals, as raw materials for Ga, Al, and In which are group III elements, respectively. The second raw material supply source 103 contains, for example, tertiarybutylarsine (TBAs), tertiarybutylphosphine (TBP), and trimethylantimony (TMSb) which are organic metals, as raw materials for As, P, and Sb which are group V elements, respectively. The third raw material supply source 104 contains, for example, tetraethylsilane (TeESi), which is an organic metal, as an n-type dopant.

These organic metals are turned into gases and transferred, together with carrier gases ($H_2$, $N_2$), to the reactor 101 from the first raw material supply source 102, the second raw material supply source 103, and the third raw material supply source 104. The flow rates of the respective organic metal gases are controlled by mass flow controllers (MFCs) 109a to 109f. Further, a vacuum pump 110 and a scrubber 111 are attached to the outlet of the reactor 101.

Figure 3:
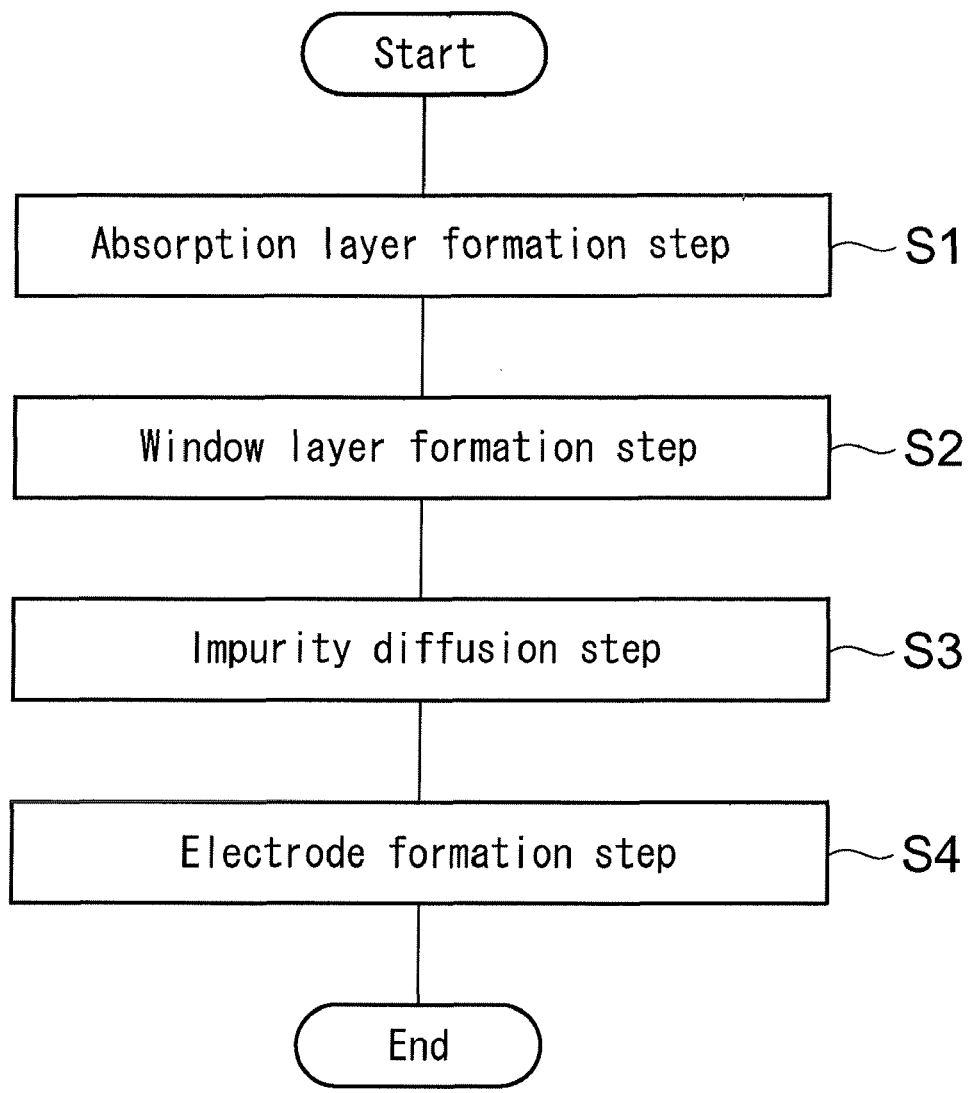
FIG. 3 is a flowchart showing process steps for manufacturing the photodiode array 1 using the MOVPE apparatus 100.
Figure 4:
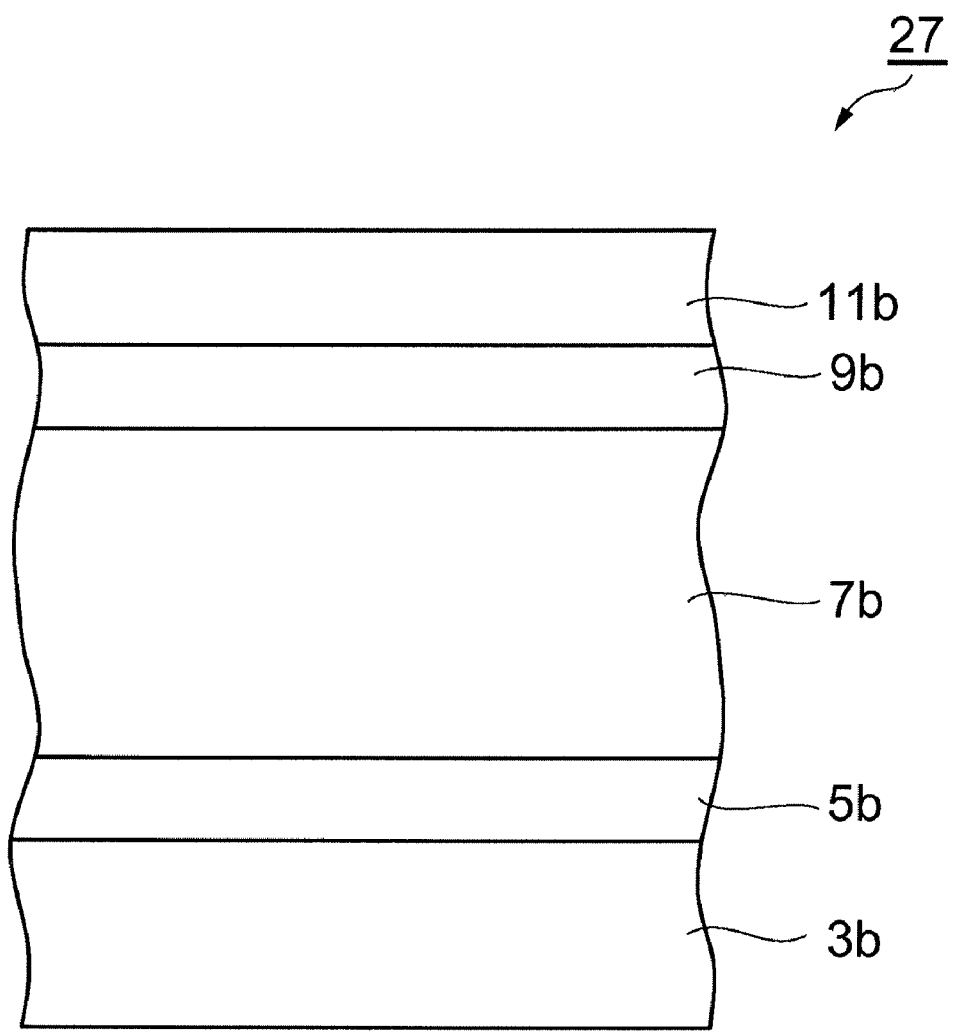
FIG. 4 is a diagram showing a structure of an epitaxial wafer 27.

Using the MOVPE apparatus 100, the photodiode array 1 of the present embodiment is manufactured in accordance with a manufacturing process shown in FIG. 3. Initially, an epitaxial wafer 27 shown in FIG. 4 is manufactured by metal-organic vapor phase epitaxy using only metal-organic sources. First, an Si-doped substrate 3b is prepared. On a main surface of the substrate 3b, an n-type doped InP buffer layer (not shown) is grown to a thickness of 10 nm. On the buffer layer, an n-type impurity doped InGaAs semiconductor layer 5b is grown to a thickness of 150 nm. On the semiconductor layer 5b, an absorption layer 7b having an InGaAs—GaAsSb type-II multiple quantum well structure is grown (absorption layer formation step S1). In the multiple quantum well structure, an undoped InGaAs layer having a thickness of 5 nm and an undoped GaAsSb layer having a thickness of 5 nm are successively disposed from the substrate side, and this double-layer structure is repeated 250 times. The specific compositions of the InGaAs layer and the GaAsSb layer in the absorption layer 7b are $In_xGa_{1-x}As$ ($0.38 \leq x \leq 0.68$) and $GaAs_{1-y}Sb_y$ ($0.36 \leq y \leq 0.62$), respectively. The absorption layer 7b may include 250 pairs of $Ga_{1-t}In_tN_u As_{1-u}$ ($0.4 \leq t \leq 0.8$, $0 < u \leq 0.2$) and $GaAs_{1-v}Sb_v$ ($0.36 \leq v \leq 0.62$).

The crystal growth temperatures for all the layers up to the formation of the absorption layer 7b are, for example, equal to or higher than 400° C. but not higher than 600° C. In the crystal growths of all the layers up to the formation of the absorption layer 7b, as raw material gases, TEGa, TBAs, and TMSb are used for GaAsSb, and TEGa, TMIn, and TBAs are used for InGaAs.

Next, an InGaAs diffusion concentration adjusting layer 9b is grown on the absorption layer 7b, and an InP window layer 11b is grown on the diffusion concentration adjusting layer 9b (window layer formation step S2). At this time, TMIn and TBP are used as raw material gases for InP. In this way, TBP, which is an organic metal, is used as a raw material for P in the present embodiment. Since the decomposition temperature of TBP is about 300° C. lower than that of phosphine ($PH_3$) which is a general raw material for P, the window layer 11b can be grown at a low temperature. That is, in the present embodiment, the growth temperature for the window layer 11b can be made equal to or lower than the growth temperature of the absorption layer 7b, preferably, equal to or higher than 400° C. but lower than 600° C. In an example, the growth temperature can be made 500° C.

When an InP window layer is grown at a growth temperature equal to or higher than 400° C. but lower than 600° C. (for example, 500° C.) using phosphine ($PH_3$), decomposition of phosphine is not sufficiently promoted, and thereby the substantial V/III ratio becomes very small. Therefore, point defects such as P-vacancies occur, which causes a difficulty in achieving excellent device characteristics.

Figure 5A:
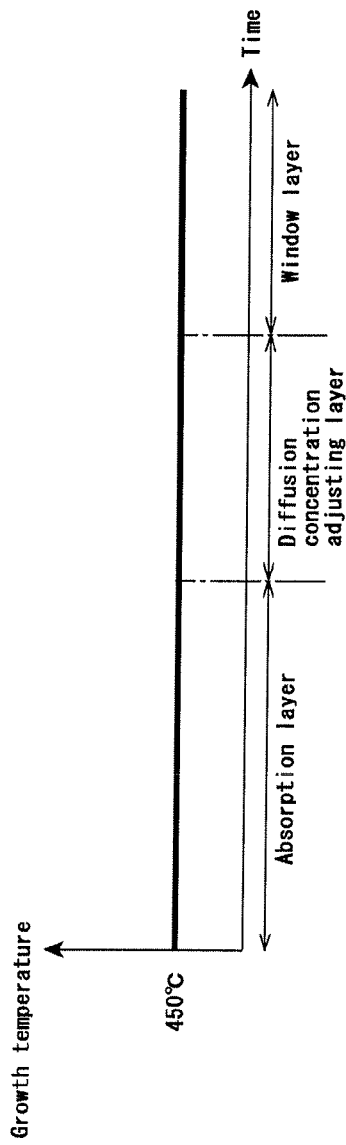
FIGS. 5A to 5C are diagrams showing examples of variations in the crystal growth temperatures when an absorption layer 7b, a diffusion concentration adjusting layer 9b, and a window layer 11b are successively grown.
Figure 5B:
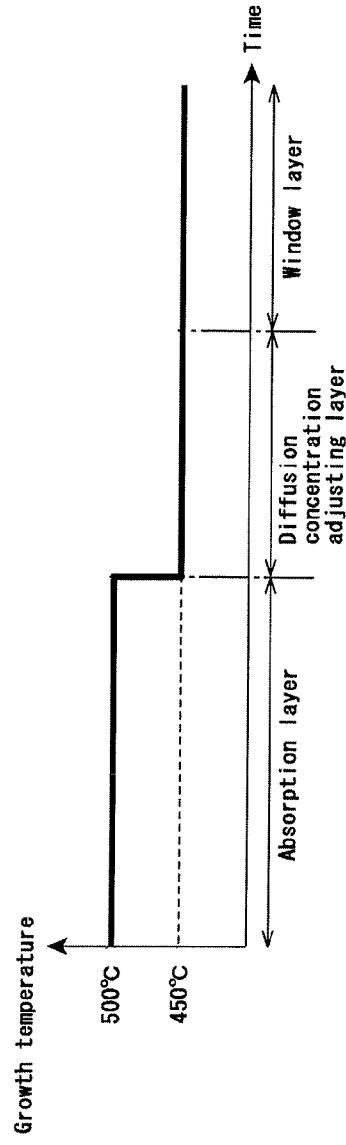
Figure 5C:
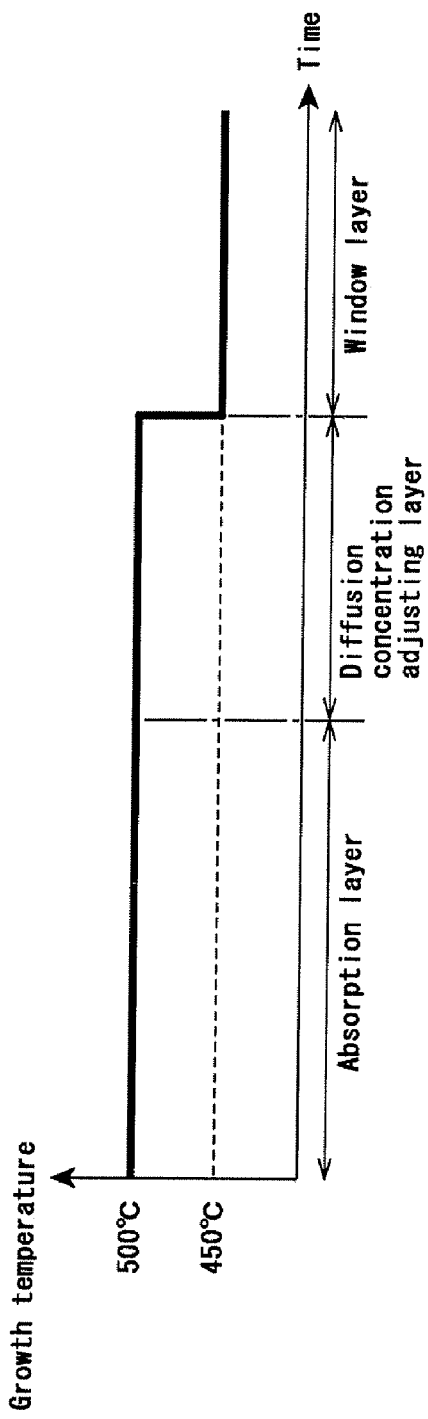

FIGS. 5A to 5C are diagrams showing examples of variations in the crystal growth temperatures when the absorption layer 7b, the diffusion concentration adjusting layer 9b, and the window layer 11b are successively grown. In a growth temperature pattern (hereinafter referred to as pattern A) shown in FIG. 5A, the absorption layer 7b, the diffusion concentration adjusting layer 9b, and the window layer 11b are grown at the same temperature (e.g., 450° C.). In a growth temperature pattern (hereinafter referred to as pattern B) shown in FIG. 5B, the absorption layer 7b is grown at a relatively high temperature (e.g., 500° C.), and the diffusion concentration adjusting layer 9b and the window layer 11b are grown at a temperature (e.g., 450° C.) lower than that of the absorption layer 7b. In a growth temperature pattern (hereinafter referred to as pattern C) shown in FIG. 5C, the absorption layer 7b and the diffusion concentration adjusting layer 9b are grown at a relatively high temperature (e.g., 500° C.), and the window layer 11b is grown at a temperature (e.g., 450° C.) lower than that of the absorption layer 7b.

In pattern B, since the absorption layer 7b is grown at the relatively high temperature, the crystalline quality is improved as compared to pattern A, and thereby dark current is reduced. In pattern C, since the absorption layer 7b and the diffusion concentration adjusting layer 9b are grown at the relatively high temperature, the crystalline quality is more improved than in pattern B, and thereby dark current is more reduced.

After the epitaxial wafer 27 is manufactured through the above-described steps, manufacturing of the photodiode array 1 is performed using the epitaxial wafer 27. First, p-type regions (corresponding to the impurity diffusion regions 25 of the photodiode array 1), which extend from the surface of the window layer 11b to the diffusion concentration adjusting layer 9b, are formed by diffusing an impurity into regions, in the window layer 11b, corresponding to the plurality of absorption regions 21 (impurity diffusion step S3). Specifically, a selective diffusion mask pattern of an SiN layer (the passivation layer 13) is formed on the window layer 11b, and a p-type impurity, Zn, is selectively diffused from the openings of the mask pattern, thereby forming the p-type regions.

Thereafter, on the parts of the surface of the window layer 11b corresponding to the p-type regions, p-type electrodes 15 composed of AuZn are provided so as to be in ohmic contact with the window layer 11b. Further, on the rear surface of the substrate 3b, an n-type electrode 17 composed of AuGeNi is provided so as to be in ohmic contact with the substrate 2b (electrode formation step S4). Through the above-described steps, the photodiode array 1 is manufactured using the epitaxial wafer 27.

The substrate 3, the semiconductor layer 5, the absorption layer 7, the diffusion concentration adjusting layer 9, and the window layer 11 of the photodiode array 1 are parts of the substrate 3b, the semiconductor layer 5b, the absorption layer 7b, the diffusion concentration adjusting layer 9b, and the window layer 11b of the epitaxial wafer 27, respectively.

The following will describe the effects achieved by the photodiode array 1 and the manufacturing method thereof, and the epitaxial wafer 27 and the manufacturing method thereof according to the present embodiment.

In the above-described manufacturing methods for the photodiode array 1 and the epitaxial wafer 27, the window layer 11b composed of a compound semiconductor including P is grown on the absorption layer 7b. Therefore, as compared to the case where an InGaAs layer is provided as a window layer (Non-Patent Document 1), the window layer 11b composed of a compound semiconductor including P allows the p-type electrodes 15 and a passivation layer 13 to be favorably formed thereon, and thus dark current at the crystal surface is reduced.

Further, in the above-described manufacturing methods for the photodiode array 1 and the epitaxial wafer 27, in the window layer formation step, the window layer 11b is grown by the MOVPE using only metal-organic sources, and the growth temperature of the window layer 11b is equal to or lower than the growth temperature of the absorption layer 7b. The MOVPE using only metal-organic sources adopts, for example, TBP which is an organic metal, as a raw material for P. Therefore, as compared to the ordinary MOVPE using phosphine, favorable crystal growth is realized even when the growth temperature of the window layer 11b is lowered, and thus the crystallinity at the surface of the window layer 11b is improved. When the growth temperature of the window layer 11b is equal to or lower than the growth temperature of the absorption layer 7b, the absorption layer 7b is prevented from being affected by the growth of the window layer 11b, and thus the crystalline quality of the absorption layer 7b is maintained, resulting in excellent characteristics.

Further, as in the present embodiment, the absorption layer may be grown, in the absorption layer formation step, by the same MOVPE using only metal-organic sources as that for the window layer. Even in this case, the above-described manufacturing methods for the photodiode array 1 and the epitaxial wafer 27 can prevent the absorption layer 7b from being affected by the growth of the window layer 11b, and can maintain the crystalline quality of the absorption layer 7b, resulting in excellent characteristics. In addition, if the layers from the absorption layer 7b to the window layer 11b are continuously grown by the MOVPE using only metal-organic sources, no regrown interface occurs between the absorption layer 7b and the window layer 11b, and thus incorporation of impurities such as O, C, and H can be avoided. For example, the concentrations of O, C, and H can be made less than $1 \times 10^{17}$ $cm^{-3}$. Accordingly, the crystalline quality of the absorption layer 7 can be maintained while sufficiently reducing surface defects of the window layer 11b.

Further, as in the present embodiment, it is preferable that the growth temperature of the window layer 11b be equal to or higher than 400° C. but lower than 600° C. When the growth temperature of the window layer 11b is lower than 600° C., the crystalline quality of the absorption layer 7b can be favorably maintained even if the absorption layer 7b includes a material such as GaAsSb that is not resistant to heat. When the growth temperature of the window layer 11b is lower than 400° C., the degree of surface defect is lessened, but the crystalline quality of the window layer 11b cannot be favorably maintained, which causes a difficulty in realizing excellent device characteristics.

The following Table 1 shows the relations among the growth temperature of the window layer 11b, the crystalline qualities of the absorption layer 7b and the window layer 11b, and the surface defects. It is found from Table that, when the growth temperature of the window layer 11b is equal to or higher than 400° C. but lower than 600° C., both improvement of crystalline qualities of the absorption layer 7b and the window layer 11b and reduction in surface defects can be achieved. In the present embodiment, the surface defects of the window layer 11b refer to defects each having a concave or convex shape of a height of 10 nm or more.

TABLE 1

| Growth temperature of InP window layer | Crystalline quality of absorption layer | Crystalline quality of window layer | Surface defect |
|---|---|---|---|
| Lower than 400° C. | ○ Good | X | ○ |
| 400° C. or higher but lower than 600° C. (present embodiment) | ○ Good | ○ Good | Δ Surface defect occurs but its area decreases with reduction in growth temperature |
| 600° C. or higher but lower than 660° C. | X Degraded by heat | ○ Good | X Surface defect having large area occurs |
| 660° C. or higher | X Degraded by heat | ○ Good | ○ Surface defect free |

Further, as in the present embodiment, it is preferable that the window layer 11b composed of InP be grown in the window formation step. That is, it is preferable that, in the photodiode array 1, the window layer 11 be composed of InP. The reason is as follows. Accumulation of technical knowledge for the technique of forming a passivation layer on the surface of InP crystal is greater than that for the technique of forming a passivation layer on the surface of InGaAs crystal, and therefore, dark current at the crystal surface can be easily reduced. Further, when light comes in the absorption layer 7 through the window layer 11, dark current can be effectively reduced while preventing absorption of near infrared light in a region on the light-incoming side relative to the absorption layer 7.

Further, as in the present embodiment, it is preferable that the absorption layer 7b having a multiple quantum well structure be formed in the absorption layer formation step. That is, it is preferable that, in the photodiode array 1 and the epitaxial wafer 27, the absorption layer 7 (7b) have a multiple quantum well structure. In the case where the absorption layer 7 (7b) has a multiple quantum well structure, if the window layer 11 (11b) is grown at a high temperature, steepness of the interface between the well layer and the barrier layer is degraded, which may cause degradation of device characteristics such as light-to-electricity conversion efficiency. However, according to the above-described photodiode array 1 and manufacturing method thereof, even if the absorption layer 7 (7b) has a multiple quantum well structure, the crystalline quality of the absorption layer 7 (7b) is maintained, and thus excellent characteristics can be obtained.

Further, as in the present embodiment, it is more preferable that the substrate 3b be an InP substrate, and the absorption layer 7b having a multiple quantum well structure be formed in the absorption layer formation step by alternately growing layers including InGaAs and layers including GaAsSb. Likewise, it is more preferable that, in the photodiode array 1 and the epitaxial wafer 27, the substrate 3 (3b) be an InP substrate, and the absorption layer 7 (7b) has a multiple quantum well structure in which layers including InGaAs and layers including GaAsSb are alternately laminated. In the case where the absorption layer 7 (7b) has such a structure, if the window layer 11 (11b) is grown at a high temperature, steepness of the interface between the GaAsSb layer and the InGaAs layer is reduced because GaAsSb is not resistant to heat, and thereby device characteristics are likely to be degraded. However, according to the above-described photodiode array 1 and manufacturing method thereof, even if the absorption layer 7 (7b) has a multiple quantum well structure in which layers including InGaAs and layers including GaAsSb are alternately laminated, the crystalline quality of the absorption layer 7 (7b) is maintained, and thus excellent characteristics can be obtained.

In the InGaAs/GaAsSb type-II multiple quantum well structure as described in the present embodiment, since the compound semiconductors having different compositions are alternately laminated a plurality of times, it is difficult to control the compositions, and strain due to lattice mismatch with the substrate is likely to be accumulated. Particularly when the number of pairs of quantum well layers and barrier layers is extremely great, such as 250 pairs or more, strain due to lattice mismatch is more likely to be accumulated. Due to such strain, surface defects are likely to occur in the window layer. Accordingly, in the photodiode array having the type-II quantum well structure, surface defects are likely to occur in the window layer. In order to reduce such surface defects, it has conventionally been necessary to grow the window layer at a high growth temperature. However, according to the photodiode array 1 of the present embodiment and manufacturing method thereof, even when the photodiode array 1 has such a structure, the crystalline quality of the absorption layer 7b can be maintained by reducing the growth temperature of the window layer 11b, and thus excellent characteristics can be obtained.

Figure 6:
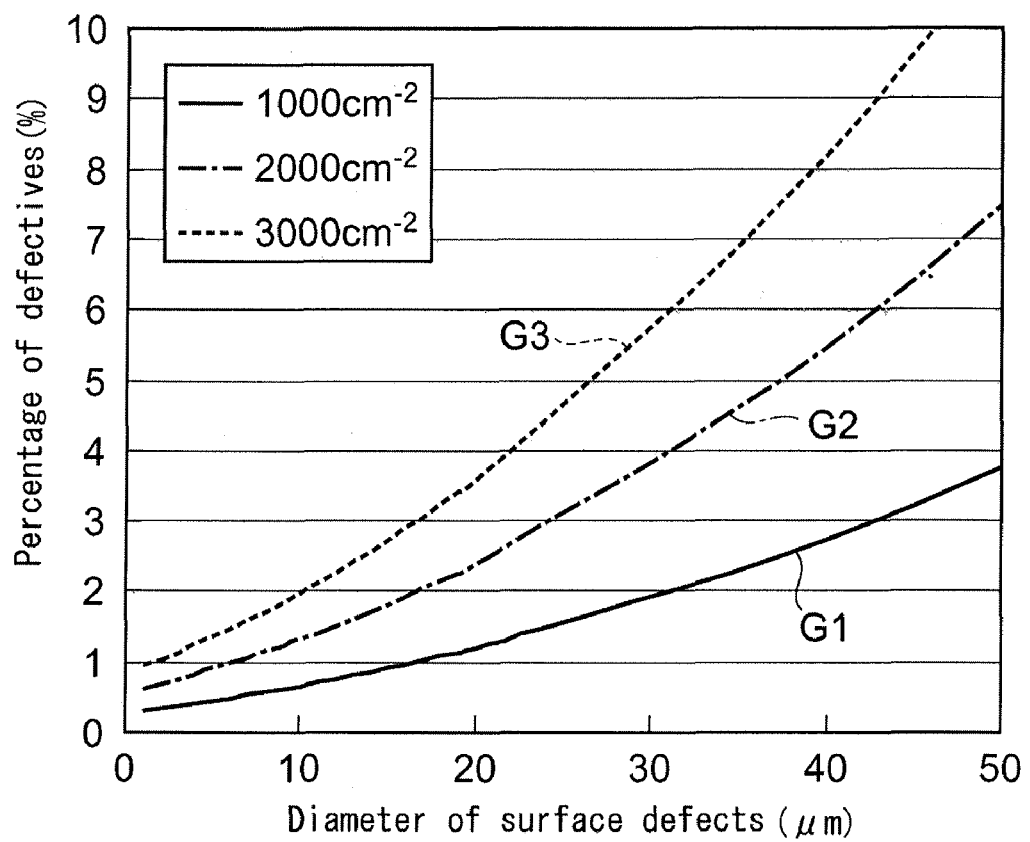
FIG. 6 is a graph showing the relation between the diameter (µm) of surface defects of a window layer 11 (11b), and the percentage of defective absorption regions, among absorption regions 21, caused by surface defects of the window layer 11 (11b)

FIG. 6 shows graphs representing the relation between the diameter (μm) of surface defects of the window layer 11 (11b), and the percentage of defective absorption regions (hereinafter referred to as percentage of defective pixels) among the absorption regions 21, which are caused by surface defects of the window layer 11 (11b). In FIG. 6, graphs G1 to G3 represent the cases where the surface defect density is 1000 cm$^{-2}$, 2000 cm$^{-2}$, and 3000 cm$^{-2}$, respectively. The percentage of defective pixels is calculated according to the following Eq. 1. In Eq. 1, D represents the surface defect density (cm$^{-2}$), and R represents the surface defect size (μmϕ). It is assumed that the pixel interval is 30 μm, and the pixel size (including impurity diffusion region) is 19 μm.

$$\text{(percentage of defective pixels)} = \frac{\text{(defect density)}}{\text{(pixel density)}} \times \begin{pmatrix} \text{probability that} \\ \text{detects overlap pixels} \end{pmatrix}$$

$$= \frac{D}{(30 \times 10^{-4})^{-2}} \times \left( \frac{\pi \times \left( \frac{19}{2} + \frac{R}{2} \right)^2}{30 \times 30} \right)$$

Equation 1

It is found from FIG. 6 that, when the surface defect density is 2000 cm$^{-2}$ and the surface defect size is 20 μmϕ, the percentage of defective pixels is 2.4%.

Figure 8A:
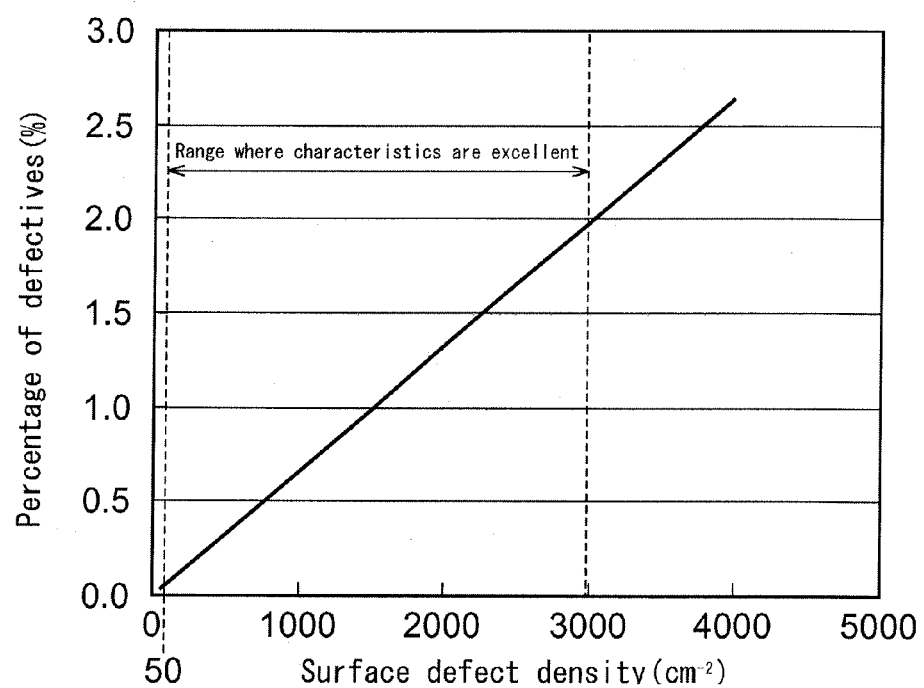
FIG. 8A is a graph showing the relation between the surface defect density of the window layer 11 and the percentage of defective absorption regions among the absorption regions 21.
Figure 8B:
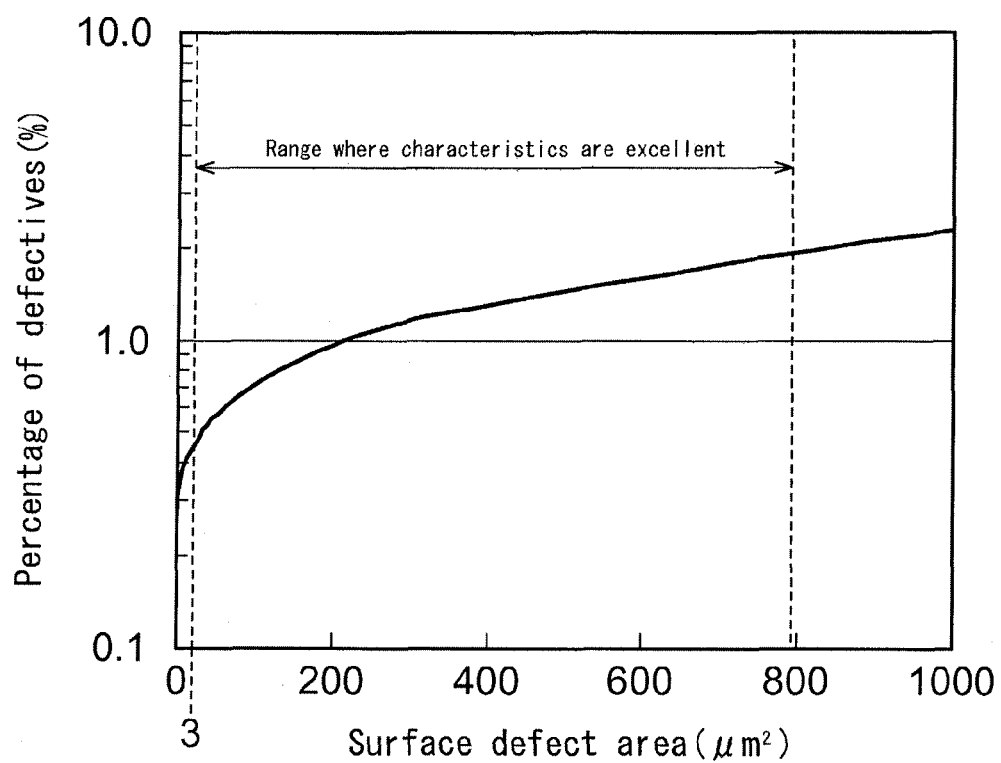
FIG. 8B is a graph showing the relation between the average area of surface defects of the window layer 11 and the percentage of defective absorption regions among the absorption regions 21.

FIG. 7 is a diagram representing the surface defect density of the window layer 11 (11b), the average area of surface defects, the percentage of defective pixels due to surface defects, the dark current, and the dark current density, which depend on the growth temperature of the window layer 11 (11b). FIG. 8A is a graph showing the relation between the surface defect density of the window layer 11 and the percentage of defective pixels. FIG. 8B is a graph showing the relation between the average area of surface defects of the window layer 11 and the percentage of defective pixels. FIG. 8A shows the case where the surface defect density is 1000 $cm^{-2}$, and FIG. 8B shows the case where the average area of surface defects is 78.5 $\mu m^2$ (10 $\mu m\phi$).

With reference to FIG. 7, as the growth temperature of the window layer 11 (11b) is lowered, the average area of surface defects becomes smaller, and the percentage of defective pixels decreases as shown in FIG. 8B. Further, as the average area of the surface defects becomes smaller, the dark current and the dark current density decrease. In particular, when the growth temperature of the window layer 11 (11b) is 525° C. or lower, the average area of surface defects of the window layer 11 (11b) is reduced to a preferable value such as 750 $\mu m^2$ or less, and the percentage of defective pixels caused by surface defects is reduced to a practical value such as 1.9% or less.

As described above, in the photodiode array 1 manufactured by the manufacturing method according to the present embodiment, the percentage of defective pixels caused by surface defects of the window layer 11 is 2% or less, and the average area of surface defects is 800 $\mu m^2$ or less. Since the percentage of defective pixels is 2% or less, sufficient characteristics are obtained for applications of the photodetector array 1 to cameras or the like. Further, since the average area of surface defects of the window layer is 800 $\mu m^2$ or less, sufficiently low percentage of defective pixels is obtained for applications of the photodiode array to cameras or the like.

In the photodiode array 1, it is preferable that the percentage of defective pixels caused by surface defects of the window layer 11 be 0.03% or more. When the percentage of defective pixels is 0.03% or more, the growth temperature of the window layer 11 need not be set at a high temperature such as 660° C. or more in order to reduce surface defects of the window layer 11. Accordingly, the absorption layer 7 is prevented from being affected by the growth of the window layer 11, and thus the crystalline quality of the absorption layer 7 is maintained, resulting in excellent characteristics.

In the photodiode array 1 and the epitaxial wafer 27, it is preferable that the surface defect density of the window layer 11 (11b) be equal to or greater than 50 $cm^{-2}$ but not greater than 3000 $cm^{-2}$. When the surface defect density of the window layer 11 (11b) is equal to or greater than 50 $cm^{-2}$, the growth temperature of the window layer 11 (11b) need not be set at a high temperature such as 660° C. or more in order to reduce the surface defect of the window layer 11 (11b). In addition, when manufacturing the photodiode array 1, excessive control for the epitaxial wafer 27 having the absorption layer 7b and the window layer 11b grown on the substrate 3b is not required, and thus the manufacturing cost can be reduced. Further, when the surface defect density of the window layer 11 is not greater than 3000 $cm^{-2}$, sufficient characteristics are obtained for applications of the photodiode array to cameras or the like.

Further, in the photodiode array 1 and the epitaxial wafer 27, it is preferable that the average area of surface defects of the window layer 11 (11b) be 3 $\mu m^2$ or more. Thereby, the growth temperature of the window layer 11 (11b) need not be set at a high temperature such as 660° C. or more in order to reduce surface defects of the window layer 11 (11b). Accordingly, the absorption layer 7 (7b) is prevented from being affected by the growth of the window layer 11 (11b), and thus the crystalline quality of the absorption layer 7 is maintained, resulting in excellent characteristics.

FIG. 9 is a diagram showing the correlations among the number of runs from reactor cleaning, the surface defect density, the average area of surface defects, the percentage of defective pixels, the dark current, and the dark current density, in the photodiode array 1 manufactured by the above-described manufacturing method (i.e., the method in which the absorption layer 7b, the diffusion concentration adjusting layer 9b, and the window layer 11b are consistently grown by the MOVPE using only metal-organic sources). As shown in FIG. 9, as the number of runs from reactor cleaning increases, the surface defect density increases. When the number of runs from reactor cleaning is 40 or less, the surface defect density of the window layer 11 (11b) is reduced to a preferable value such as 3000 $cm^{-2}$ or less, and the percentage of defective pixels caused by surface defects is reduced to a practical value such as 2.0% or less.

In the above-described method for manufacturing the photodiode array 1, the absorption layer 7b is grown by the MOVPE using only metal-organic sources in the absorption layer formation step. However, in the photodiode array manufacturing method of the present invention, the absorption layer may be grown by molecular beam epitaxy in the absorption layer formation step. Also in this case, according to the photodiode array manufacturing method of the present invention, the absorption layer is prevented from being affected by the growth of the window layer, and thus the crystalline quality of the absorption layer is maintained, resulting in excellent characteristics.

What is claimed is:

1. A method for manufacturing a photodiode array having a plurality of absorption regions that are one-dimensionally or two-dimensionally arranged, the method comprising:
    an absorption layer formation step of growing an absorption layer on a first conductivity type group III-V semiconductor substrate;
    a window layer formation step of growing a window layer on the absorption layer, the window layer being composed of a compound semiconductor including P, and having a band gap energy greater than a band gap energy of the absorption layer; and
    an impurity diffusion step of diffusing a second conductivity type impurity in regions, in the window layer, corresponding to the plurality of absorption regions; wherein
    in the window layer formation step, the window layer is grown by metal-organic vapor phase epitaxy using only metal-organic sources, and a growth temperature of the window layer is equal to or lower than a growth temperature of the absorption layer.

2. The method according to claim 1, wherein in the absorption layer formation step, the absorption layer is grown by metal-organic vapor phase epitaxy using only metal-organic sources.

3. The method according to claim 1, wherein in the absorption layer formation step, the absorption layer is grown by molecular beam epitaxy.

4. The method according to claim 1, wherein the growth temperature of the window layer is equal to or higher than 400° C. but lower than 600° C.

5. The method according to claim 1, wherein in the window layer formation step, the window layer composed of InP is grown.

6. The method according to claim 1, wherein in the absorption layer formation step, the absorption layer having a multiple quantum well structure is formed.

7. The method according to claim 6, wherein
the group III-V semiconductor substrate is an InP substrate; and
in the absorption layer formation step, the absorption layer having a multiple quantum well structure is formed by alternately growing barrier layers including InGaAs and well layers including GaAsSb.

8. The method according to claim 7, wherein in the absorption layer formation step, the multiple quantum well structure of the absorption layer is formed by alternately growing $In_xGa_{1-x}As$ ($0.38 \leqq x \leqq 0.68$) and $GaAs_{1-y}Sb_y$ ($0.36 \leqq y \leqq 0.62$), or by alternately growing $Ga_{1-u}In_u N_v As_{1-v}$ ($0.4 \leqq u \leqq 0.8$, $0 \leqq v \leqq 0.2$) and $GaAs_{1-y}Sb_y$ ($0.36 \leqq y \leqq 0.62$).

9. A method for manufacturing an epitaxial wafer which is used for manufacturing a photodiode array having a plurality of absorption regions arranged one-dimensionally or two-dimensionally, the method comprising:
an absorption layer formation step of growing an absorption layer on a first conductivity type group III-V semiconductor substrate; and
a window layer formation step of growing a window layer on the absorption layer, the window layer being composed of a compound semiconductor including P, and having a band gap energy greater than a band gap energy of the absorption layer; wherein
in the window layer formation step, the window layer is grown by metal-organic vapor phase epitaxy using only metal-organic sources, and a growth temperature of the window layer is equal to or lower than a growth temperature of the absorption layer.

10. The method according to claim 9, wherein in the absorption layer formation step, the absorption layer is grown by metal-organic vapor phase epitaxy using only metal-organic sources.

11. The method according to claim 9, wherein in the absorption layer formation step, the absorption layer is grown by molecular beam epitaxy.

12. The method according to claim 9, wherein the growth temperature of the window layer is equal to or higher than 400° C. but lower than 600° C.

* * * * *